United States Patent
Sekiguchi et al.

(10) Patent No.: US 8,310,267 B2
(45) Date of Patent: Nov. 13, 2012

(54) SEMICONDUCTOR INTEGRATED CIRCUIT, AND METHOD FOR TESTING SEMICONDUCTOR INTEGRATED CIRCUIT

(75) Inventors: Toru Sekiguchi, Kanagawa (JP); Tsuyoshi Eda, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 377 days.

(21) Appl. No.: 12/823,674

(22) Filed: Jun. 25, 2010

(65) Prior Publication Data
US 2011/0001508 A1    Jan. 6, 2011

(30) Foreign Application Priority Data
Jul. 1, 2009 (JP) .................... 2009-157218

(51) Int. Cl.
*G01R 31/02* (2006.01)
*G01R 31/3187* (2006.01)
(52) U.S. Cl. ............... 324/762.01; 324/537; 324/750.3
(58) Field of Classification Search .......... 324/500, 324/537, 719, 750.3, 762.01–762.09
See application file for complete search history.

(56) References Cited

U.S. PATENT DOCUMENTS

| | | | | |
|---|---|---|---|---|
| 5,952,838 A * | 9/1999 | Tikhonov | ................. | 324/756.05 |
| 6,844,751 B2 * | 1/2005 | Marshall et al. | ......... | 324/754.03 |
| 6,927,594 B2 * | 8/2005 | Fujinaga et al. | ......... | 324/762.01 |
| 7,061,264 B2 * | 6/2006 | Kang et al. | ............... | 324/750.11 |
| 7,176,486 B2 * | 2/2007 | Nasuno et al. | ................. | 257/48 |
| 7,525,304 B1 * | 4/2009 | Feng et al. | ............... | 324/762.01 |
| 7,859,285 B2 * | 12/2010 | Sheu et al. | ................ | 324/750.3 |
| 2004/0257104 A1 | 12/2004 | Fujinaga et al. | | |
| 2007/0145999 A1 * | 6/2007 | Cano et al. | .................. | 324/765 |
| 2007/0296439 A1 * | 12/2007 | Feustel et al. | ................ | 324/763 |

FOREIGN PATENT DOCUMENTS

JP 6-216208    8/1994
JP 2005-011970    1/2005

* cited by examiner

*Primary Examiner* — Joshua Benitez Rosario
(74) *Attorney, Agent, or Firm* — Young & Thompson

(57) ABSTRACT

In order to reduce the number of electrodes included in test patterns, the semiconductor integrated circuit includes, a plurality of first and second chains, a first common electrode connected to one end of each first chain, a second common electrode connected to one end of each second chain, and a plurality of selection electrodes. Each selection electrode is connected to the other end of any one of the plurality of first chains and to the other end of any one of the plurality of second chains. When a test target chain is selected from the plurality of first chains, a first reference voltage is applied to the first common electrode, a second reference voltage is applied to a target selection electrode that is connected to the test target chain, and a current flowing in the target selection electrode is measured to obtain a resistance value of the test target chain.

11 Claims, 4 Drawing Sheets

SEMICONDUCTOR INTEGRATED CIRCUIT, AND METHOD FOR TESTING SEMICONDUCTOR INTEGRATED CIRCUIT

INCORPORATION BY REFERENCE

This patent application claims a priority on convention based on Japanese Patent Application No. 2009-157218. The disclosure thereof is incorporated herein by reference.

BACKGROUND OF THE INVENTION

1. Field of the Invention

The present invention relates to a semiconductor integrated circuit and to a method for testing the semiconductor integrated circuit.

2. Description of Related Art

A semiconductor integrated circuit is known. The semiconductor integrated circuit includes a semiconductor chip. The semiconductor chip includes a plurality of wiring layers and contacts (vias or contacts) for connecting the plurality of wiring layers. Additionally, in order to check whether or not resistance values of the contacts and the wirings are desirable, a chain structure is installed in the semiconductor chip. The chain structure includes wirings formed in the wiring layers, and the contacts for connecting them. For example, when a number of the wiring layers is three, a chain structure is formed of: a diffusion layer; a first layer wiring; a second layer wiring; a third layer wiring; a first via for connecting the first layer wiring to the diffusion layer; a second via for connecting the first layer wiring to the second layer wiring; and a third via for connecting the second layer wiring to the third layer wiring. The resistance value of the chain structure is measured to check the resistance values of the wirings and the contacts.

When checking the resistance values, it is required to identify a failed wiring layer or contact. For this reason, a plurality of chain structures are formed to correspond to the plurality of wiring layers. In order to check the resistance values of the respective chain structures, electrodes are provided on both ends of the respective chain structures. The resistance of the respective chain structures is measured by probing the electrodes.

On the other hand, in document 1 (Japanese patent publication JP-A-Heisei-6-216208), a unit for measuring a contact of an integrated circuit is disclosed, which has a plurality of contacts arranged to have an (m×n)-matrix shape on a substrate, m number of first layer wirings for connecting the contacts of the same row each other with wirings from one electrode side, and m number of second layer wirings for connecting the contacts of the same column each other with wirings from the other electrode side.

Furthermore, in document 2 (Japanese patent publication JP-A-2005-11970), a testing device for a conductor device is disclosed, which includes a switching transistor and a first resistor element. In the switching transistor, a gate is connected to a signal line, and one of a source and drain is connected to a first wiring. In the first resistor element, one terminal is connected to one of the source and drain included in the switching transistor, and another terminal is connected to a second wiring. The first resistor element includes at least one of a means for electrically connection.

SUMMARY

The number of the wiring layers included in the semiconductor integrated circuit has been increased. In a multi-layered wiring structure, in order to measure the resistance values of the wiring layers and contacts, a lot of test patterns are required. Therefore, a layout area is increased. As an example, a semiconductor integrated circuit will be focused, which has 9 layers structure including a diffusion layer as a first layer. In this case, a first chain (the diffusion layer, a second layer wiring, and a contact between the diffusion layer and the second layer wiring), a second chain (the second layer wiring, the third layer wiring, and a contact between the second layer wiring and the third layer wiring), . . . , and a eighth chain (an eighth layer wiring, a ninth layer wiring, and the contact between the eighth layer wiring and the ninth layer wiring) are required as the test patterns. Namely, eight kinds of test patterns are required. As the result, the layout area is increased. Accordingly, it becomes difficult to realize a high integration. Furthermore, when the electrodes are provided on both ends of the respective chains, 16 electrodes are totally required. That is, the number of the electrodes is also increased. The number of the electrodes able to be arranged in the semiconductor integrated circuit is limited. When the number of the electrodes for measurement is increased, the number of the electrodes able to be used in a production circuit will be decreased. As the results, a production design will be greatly influenced.

According to document 1, the contacts are arranged to have a matrix shape. Therefore, a number of the contacts able to be arranged in a unit area is limited. Furthermore, since the electrode is required for each of the wirings drawn from the respective contacts, there is a problem that the number of the electrodes cannot be decreased.

Also, according to document 2, a selecting circuit, a switching transistor, and a wiring region where the circuit and transistor are connected to a measured region is required other than a measured element region. Therefore, the problem that a layout area increases is not solved.

The semiconductor integrated circuit according to the present invention includes a plurality of first chains, a plurality of second chains, a first common electrode connected to one end of the each first chain, a second common electrode connected to one end of the each second chain, and a plurality of selection electrodes. The each selection electrode is connected to another end of any one of the first chains and is connected to another end of any one of the second chains. When a test target chain is selected from the plurality of the first chains, a first reference voltage is applied to the first common electrode, a second reference voltage is applied to the second common electrode, and the second reference voltage is applied to a target selection electrode that is selected from the plurality of selection electrode and connected to the test target chain. A value of a current flowing in the target selection electrode is measured, and the resistance of the test target chain is obtained.

According to the present invention, with providing the first common electrode and the second common electrode, the electrodes for a plurality of chains can be used in common. As a result, the electrodes can be decreased in number, and the layout area can be decreased in size.

The method for testing an integration circuit according to the present invention includes, applying a first reference voltage to one end of each of a plurality of first chains, applying a second reference voltage to one end of each of a plurality of second chains, selecting a test target chain from the plurality of first chains, applying the second reference voltage to another end of the test target chain and to a target selection electrode that is connected to another end of any one of the plurality of second chain, and obtaining a resistance value of the test target chain by measuring a current flowing in the target selection electrode.

According to the present invention, a semiconductor integrated circuit and a method for testing the semiconductor integrated circuit are provided, which can reduce the number of electrodes included in the test pattern.

BRIEF DESCRIPTION OF DRAWINGS

The above and other objects, advantages and features of the present invention will be more apparent from the following description of certain preferred embodiments taken in conjunction with the accompanying drawings, in which.

DESCRIPTION OF THE PREFERRED EMBODIMENTS

First Embodiment

Referring to drawings, a first embodiment according to the present invention will be explained below.

Figure 1:
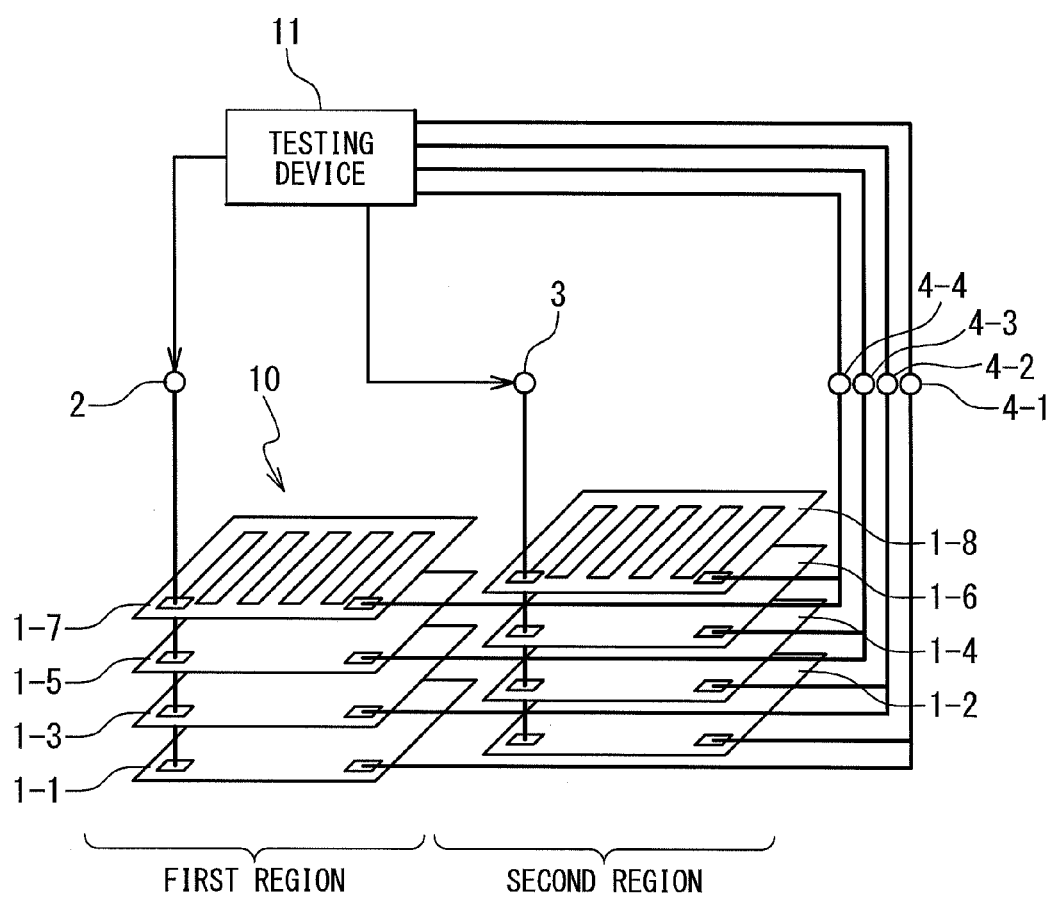
FIG. 1 is a schematic diagram showing a semiconductor integrated circuit according to a first embodiment.

FIG. 1 is a schematic diagram showing a semiconductor integrated circuit 10 according to the present embodiment. As shown in FIG. 1, the semiconductor integrated circuit 10 includes a plurality of chains (1-1 to 1-8) (8 chains in the present embodiment) provided on a substrate (not shown), a first common electrode 2, a second common electrode 3, and a plurality of selection electrodes 4 (4-1 to 4-4). Also, a first region and a second region are set in the semiconductor integrated circuit 10. In the plurality of chains 1-1 to 1-8, odd-numbered $(2n-1)^{th}$; n is a positive integer number) chains (1-1, 1-3, 1-5, 1-7) are stacked on the first region. Each of the chains (1-1, 1-3, 1-5, 1-7) will be referred to as a first chain below. On the other hand, even-numbered ($2n^{th}$ chain) chains (1-2, 1-4, 1-6, 1-8) are stacked on the second region. Each of the chains (1-2, 1-4, 1-6, 1-8) will be referred to as a second chain below.

Figure 2:
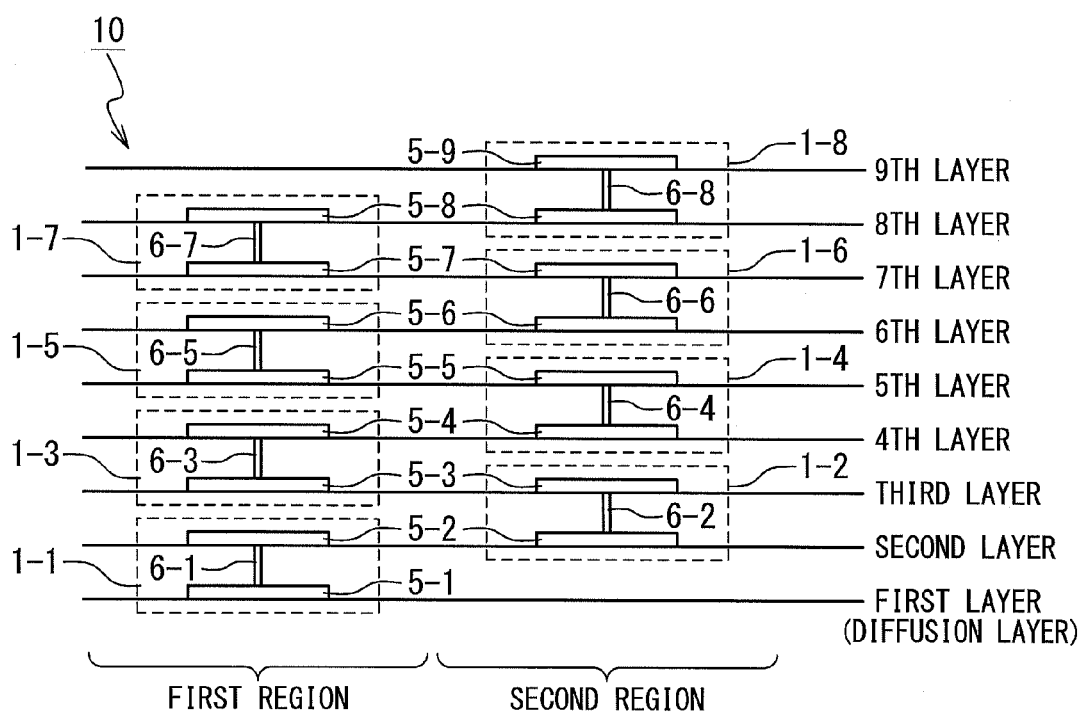
FIG. 2 is a schematic diagram showing a relationship between chains and wiring layers.

FIG. 2 is a schematic diagram showing a relationship between the chains and wiring layers. As shown in FIG. 2, 9 wiring layers are provided on the substrate. The first layer of the 9 wiring layers is a diffusion layer. Wiring patterns 5 (5-1 to 5-9) are provided in the wiring layers. Also, on the substrate, contacts 6 (6-1 to 6-8) are provided for connecting the wiring patterns 5 between the wiring layers. The each first chain (1-1, 1-3, 1-5, 1-7) has a wiring pattern 5 (the $(2n-1)^{th}$ wiring pattern) provided in the $(2n-1)^{th}$ wiring layers, a wiring pattern 5 ($2n^{th}$ wiring pattern) provided in the $2n^{th}$ wiring layers, and a contact 6 ($(2n-1)^{th}$ contact) for connecting the $(2n-1)^{th}$ wiring pattern and the $2n^{th}$ wiring pattern. For example, the first chain 1-1 has a wiring pattern 5-1 provided in the wiring layer 1-1 (the diffusion layer), a wiring pattern 5-2 provided in the wiring layer 1-2, and a contact 6-1 (contact) for connecting the wiring pattern 5-1 and the wiring pattern 5-2. On the other hand, the each second chain (1-2, 1-4, 1-6, 1-8) has a wiring pattern 5 ($(2n)^{th}$ wiring pattern) provided in the $(2n)^{th}$ wiring layer, a wiring pattern 5 ($(2n+1)^{th}$ wiring pattern) provided in the $(2n+1)^{th}$ wiring layers, and a contact 6 ($(2n)^{th}$ contact) for connecting the $(2n)^{th}$ wiring pattern and the $(2n+1)^{th}$ wiring pattern. In the 2-th wiring layer to the 8-th wiring layer, the wiring patterns are provided on both of the first region and the second region. For example, the first chain 1-1 is formed by, a wiring pattern 5-1 formed in the diffusion layer, a part of the wiring pattern 5-2 provided on the first region, and a contact 6-1 for connecting them.

Figure 3:
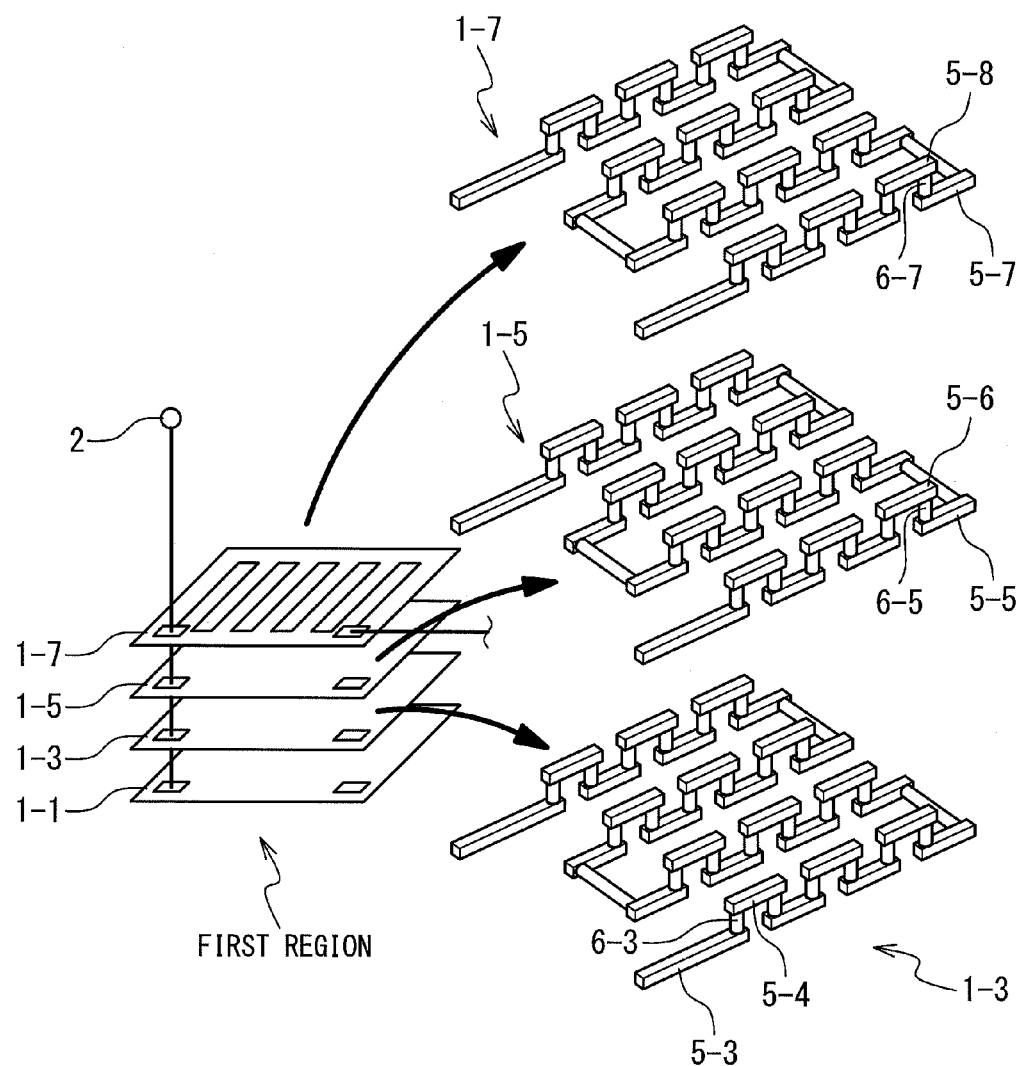
FIG. 3 is a schematic diagram showing a configuration of each chain.

FIG. 3 is a schematic diagram showing a configuration of the each chain. In FIG. 3, configurations of the first chains are schematically shown. As shown in FIG. 3, the each chain has a wiring of a lower layer, a wiring of an upper layer, and a contact for connecting them. For example, the first chain 1-3 has a wiring pattern 5-3 as the lower layer, a wiring pattern 5-4 as the upper layer, and a contact 6-3 for connecting the wiring pattern 5-3 and the wiring pattern 5-4. Similarly, the first chain 1-5 has a wiring pattern 5-5 as the lower layer, a wiring pattern 5-6 as the upper layer, and a contact 6-5 for connecting the wiring pattern 5-5 and the wiring pattern 5-6. The first chain 1-7 has a wiring pattern 5-7 as the lower layer, a wiring pattern 5-8 as the upper layer, and a contact 6-3 for connecting the wiring pattern 5-7 and the wiring pattern 5-8.

FIG. 1 will be referred again. The first common electrode 2 is an electrode shared by the plurality of the first chains (1-1, 1-3, 1-5, 1-7). Namely, the first common electrode 2 is connected to respective one end of the first chains. The second common electrode 3 is an electrode shared by the plurality of the second electrodes (1-2, 1-4, 1-6, 1-8). The second common electrode 3 is connected to respective one end of the second chains.

The each of the plurality of selection electrodes 4 is connected to another end of any one of the plurality of first chains, and is connected to another end of any one of the plurality of second chains. For example, the selection electrode 4-1 is connected to the other end of the first chain 1-1 and is connected to the other end of the second chain 1-2. The selection electrode 4-2 is connected to the other end of the first chain 1-3 and is connected to the other end of the second chain 1-4. The selection electrode 4-3 is connected to the other end of the first chain 1-5 and is connected to the other end of the second chain 1-6. The selection electrode 4-4 is connected to the other end of the first chain 1-7 and is connected to the other end of the second chain 1-8.

As shown in FIG. 1, a testing device 11 is connected to the first common electrode 2, the second common electrode 3, and the respective selection electrode 4. The testing device 11 applies a predetermined voltage to these electrodes.

Figure 4:
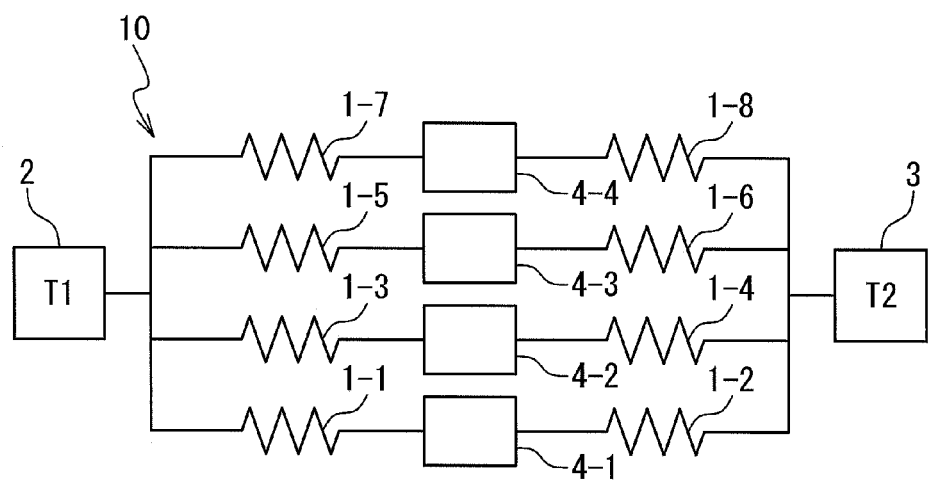
FIG. 4 is a circuit diagram showing a semiconductor integrated circuit according to a first embodiment.

FIG. 4 is a circuit diagram showing the semiconductor integrated circuit 10 described above. In FIG. 4, an illustration of the testing device 11 is omitted.

Referring to FIG. 4, the method for testing the semiconductor integrated circuit 10 according to the present embodiment will be explained.

At first, the first chain 1-7 is selected as a test target chain. A first reference voltage is applied to the electrodes other than the first common electrode 2 and the selection electrode 4-4 (a target selection electrode), by the testing device 1. Namely, as the first reference voltage, a positive voltage is applied to the second common electrode 3 and the selection electrodes 4-1 to 4-3.

Next, a ground voltage is applied to the first common electrode 2 as a second reference voltage, by the testing device 11.

Subsequently, the first reference voltage is applied to the target selection electrode 4-4 by the testing device 11. Then, a current flowing in the target selection electrode 4-4 is measured by the testing device 11. At this time, potentials of the second common electrode 3 and the selection electrodes 4-1 to 4-3 are equal to that of the target selection electrode 4-4. Accordingly, in the target selection electrode 4-4, a current does not flow toward electrodes other than the first common electrode 2. That is, the current flowing in the target selection electrode 4-4 is a current flowing to the first common electrode 2 via the first chain 1-7. Accordingly, a resistance value of the first chain 1-7 can be calculated on the basis of the measured current value and the first reference voltage.

After the measurement for the first chain 1-7, the first chain 1-5 is measured. The first reference voltage is applied to the electrodes except for the first common electrode 2 and the selection electrode 4-3 (target selection electrode), by the testing device 11. Next, the ground voltage is applied to the first common electrode 2 by the testing device 11. Then, the first reference voltage is applied to the target selection electrode 4-3, and the current flowing in the target selection electrode is measured. The measured current is a current that flows to the first common electrode 2 from the target selection electrode 4-3 via the first chain 1-5. Accordingly, the resistance value of the first chain 1-5 can be estimated, based on the measured current value and the first reference voltage.

Then, similarly, the resistance values of the other first chains (1-1, 1-3) are measured.

Subsequently, the resistance value of the second chain 1-8 is measured. The first reference voltage is applied to the electrodes other than the second common electrode 3 and the selection electrode 4 (target selection electrode), by the testing device 11. Next, the ground voltage (the second reference voltage) is applied to the second common electrode 3, by the testing device 11. Then, the testing device 11 applies the first reference voltage to the target selection electrode 4-4 to measure the current flowing in the target selection electrode 4-4. The measured current is a current flowing in the second chain 1-8. Accordingly, the resistance value of the second chain 1-8 can be estimated, based on the measured current value. Then, similarly, the resistance values of the other second chains (1-2, 1-4, 1-6) are measured.

According to the test method described above, the resistance value of the each chain can be obtained.

Here, according to the present embodiment, the electrodes used in the test can be decreased in number. For comparison to the present embodiment, a case where electrodes connected to both ends of 8 chains are separately provided will be considered. In this case, 16 electrodes are required for the test. On the other hand, according to the present embodiment, only 6 electrodes (first common electrode, second common electrode, and selection electrodes 4-1 to 4-4) are required for the test. Namely, the number of the electrodes can be reduced by approximately 63%. If k layers are provided in addition to the diffusion layer, the present embodiment can reduce the number of the electrodes by a number shown below. When k is an even number, the number of the electrodes can be reduced by $[\{1-(k/2+2)/(k\times2)\}\times100]\%$. When k is an odd number, the number of the electrodes can be reduced by $[\{1-(k/2+2.5)/(k\times2)\}\times100]\%$. When the number of the wiring layers is large, the large number of the electrodes can be reduced by the present embodiment.

Furthermore, in the present embodiment, a plurality of the first chains is stacked on the first region, and a plurality of second chains are stacked on the second region. In comparison to a case where the plurality of chains are arranged so as not to over lap, approximately 75% of the layout area can be decreased.

If k layers and a diffusion layer are provided in the semiconductor integrated circuit, the present embodiment can reduce the size of the layout area by $[(1-2/k)\times100]\%$. When the number of the wiring layers is large, the reduced area size can be increased.

In the present embodiment, the case where the resistance values of the respective second chains are tested after testing the resistance values of the respective first chains has been explained. However, the order of the test is not limited, and the test can be executed in any order.

Second Embodiment

Subsequently, the second embodiment will be explained. In the present embodiment, the number of the selection electrodes 4 and the connection relationship between the selection electrodes 4 and chain structures are changed from those of the first embodiment. Since the other points may be same as those of the first embodiment, detailed descriptions will be omitted.

Figure 5:
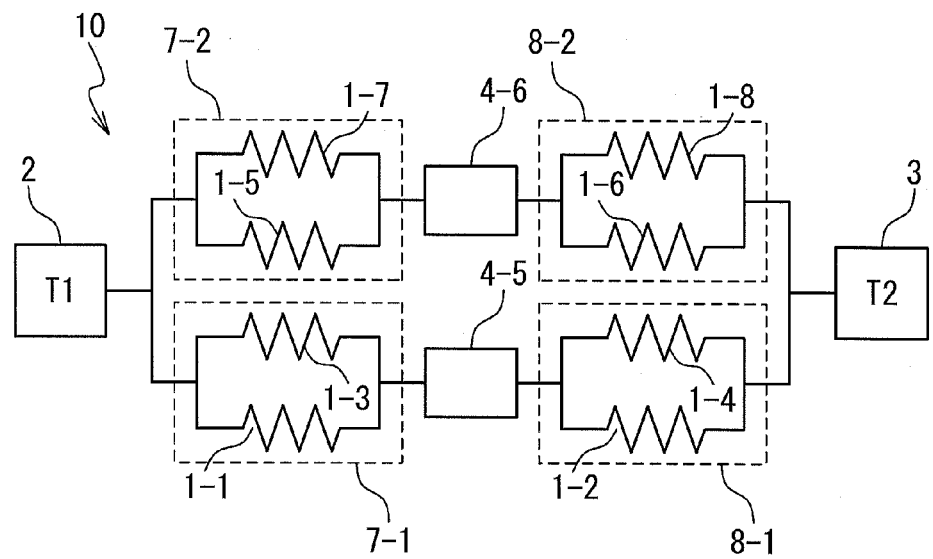
FIG. 5 is a circuit diagram showing a semiconductor integrated circuit according to a second embodiment.

FIG. 5 is a circuit diagram showing a semiconductor integrated circuit according to the present embodiment. In the present embodiment, two selection electrodes (4-5, 4-6) are provided. Additionally, a first chain group 7-1 is formed of the first chain 1-1 and the first chain 1-3. Similarly, a first chain group 7-2 is formed of the first chain 1-5 and the first chain 1-7. A second chain group 8-1 is formed of the second chain 1-2 and the second chain 1-4. A second chain group 8-2 is formed of the second chain 1-6 and the second chain 1-8.

The selection electrode 4-5 is connected to another end of the first chain group 7-1 and to another end of the second chain group 8-1. The selection electrode 4-6 is connected to another end of the first chain group 7-2 and to another end of the second chain group 8-2.

Then, the method for testing the semiconductor integrated circuit according to the present embodiment will be explained. In the present embodiment, a test target chain group is selected from a plurality of the chain groups. At first, a case will be explained in which the first chain group 7-2 is selected as the test target chain group.

In the first chain group 7-2, it is assumed that a designed resistance value of the first chain 1-7 is sufficiently larger than that of the first chain 1-5. Additionally, it is assumed that a difference between them is sufficiently larger than measurement accuracy and a variation in resistance. Additionally, it is assumed that a difference between a combined resistance value of the first chain group 7-2 and the designed resistance value of the first chain 1-7 is also sufficiently large. Furthermore, it is assumed that a difference between the combined resistance value and the designed resistance value of the first chain 1-5 is also sufficiently large. As an example, a case will be explained, in which the designed resistance value of the first chain 1-7 is 20Ω and the designed resistance value of the first chain 1-5 is 10Ω.

At first, the first reference voltage is applied to the electrodes except for the first common electrode 2 and the selection electrode 4-6 (a target selection electrode), by the testing device 11. Namely, the first reference voltage is applied to the second common electrode 3 and the selection electrode 4-5. Next, the first common electrode 2 is grounded by the testing device 11. Namely, the ground voltage is applied as the second reference voltage.

Then, the first reference voltage is applied to the target selection electrode 4-6, and a current flowing in the target selection electrode 4-6 is measured. At this time, the measured current is a current flowing toward the first common electrode 2 via the first chain group 7-2. Accordingly, a combined resistance value of the first chain group 7-2 can be obtained, based on the measured current value and the first reference voltage. If both of two chains included in the first chain group 7-2 are normal, 6.7Ω is obtained as the combined resistance value. On the other hand, if the first chain 1-7 is opened, 10Ω is obtained as the combined resistance value. If the first chain 1-5 is opened, 20Ω is obtained as the combined resistance value. Accordingly, a failed chain can be identified based on the obtained combined resistance value.

Then, similarly, regarding other test target chain group, the combined resistance values are obtained to test the chains. Thus, regarding each of the 8 chains, the resistance value can be checked.

According to the present embodiment, a same function effect as that of the first embodiment can be obtained. Additionally, according to the present embodiment, the selection electrodes 4 can be further reduced in number. If 8 chains are provided, the number of the electrodes can be reduced to 4 from 16 (approximately 75% reduction). If k layers and a diffusion layer are provided in the semiconductor integrated circuit, the present embodiment can reduce the electrodes by a number shown blow. When k is 1 to 4, the electrodes can be reduced by $[1-3/(k\times 2)\times 100]\%$. When k is 5 to 8, the electrodes can be reduced by $[1-4/(k\times 2)\times 100]\%$. When k is 9 to 12, the electrodes can be reduced by $[1-5/(k\times 2)\times 100]\%$. As mentioned above, the larger the number of the wiring layers included in the semiconductor integrated circuit is, the larger the reduction effect of the number of electrodes due to the present embodiment becomes.

Although the inventions has been described above in connection with several preferred embodiments thereof, it will be apparent to those skilled in the art that those embodiments are provided solely for illustrating the invention, and should not be relied upon to construe the appended claims in a limiting sense.

What is claimed is:

1. A semiconductor integrated circuit, comprising:
    a plurality of first chains;
    a plurality of second chains;
    a first common electrode connected to one end of each of said plurality of first chains;
    a second common electrode connected to one end of each of said plurality of second chains; and
    a plurality of target selection electrodes
    wherein each of said plurality of target selection electrodes are connected to any one of said plurality of first chains and to any one of said plurality of second chains,
    wherein when a test target chain is selected from said plurality of first chains, a first reference voltage is applied to said first common electrode, a second reference voltage is applied to said second common electrode, said second reference voltage is applied to a target selection electrode that is connected to said test target chain, and a current flowing through said target selection electrode is measured to obtain a resistance value of said test target chain.

2. The semiconductor integrated circuit according to claim 1, wherein said plurality of first chains are stacked on a first region, and said plurality of second chains are stacked on a second region.

3. The semiconductor integrated circuit according to claim 1, wherein when said test target chain is selected from said plurality of second chains, said second reference voltage is applied to said first common electrode, said first reference voltage is applied to said second common electrode, said second reference voltage is applied to said target selection electrode, and a current flowing through said target selection electrode is measured to obtain a resistance value of said test target chain.

4. The semiconductor integrated circuit according to claim 3, wherein said plurality of first chains and said plurality of second chains are alternately stacked in a stacking direction.

5. The semiconductor integrated circuit according to claim 1,
    wherein each of said first chains comprises:
    a $(2n-1)^{th}$ wiring pattern part provided in a $(2n-1)^{th}$ wiring layer;
    a $(2n)^{th}$ wiring pattern part provided in a $(2n)^{th}$ wiring layer; and
    a $(2n-1)^{th}$ contact for connecting said $(2n-1)^{th}$ wiring pattern part to said $(2n)^{th}$ wiring pattern part,
    wherein said n is a positive integer number and
    wherein each of said second chains comprises:
    a $(2n)^{th}$ wiring pattern part provided in said $(2n)^{th}$ wiring layer;
    a $(2n+1)^{th}$ wiring pattern part provided in a $(2n+1)^{th}$ wiring layer; and
    a $(2n)^{th}$ contact for connecting said $(2n)^{th}$ wiring pattern part and said $(2n+1)^{th}$ wiring pattern part.

6. A semiconductor integrated circuit comprising:
    a plurality of first chain groups, each of which comprises a plurality of first chains;
    a plurality of second chain groups, each of which comprises a plurality of second chains;
    a first common electrode connected to one end of each of said plurality of first chain groups;
    a second common electrode connected to one end of each of said plurality of second chain groups; and
    a plurality of target selection electrodes
    wherein each of said plurality of target selection electrodes are connected to the other end of any one of said plurality of first chain groups and to the other end of any one of said plurality of second chain groups,
    wherein when a test target chain group is selected from said first chain groups, a first reference voltage is applied to said first common electrode, a second reference voltage is applied to said second common electrode, said second reference voltage is applied to a target selection electrode that is connected to said test target chain group, and a current flowing through said target selection electrode is measured to obtain a resistance value of said test target chain group.

7. A method for testing a semiconductor integrated circuit comprising:
    applying a first reference voltage to one end of each of a plurality of first chains;
    applying a second reference voltage to one end of each of a plurality of second chains;
    selecting a test target chain from said plurality of first chains;
    applying said second reference voltage to a target selection electrode, wherein said target selection electrode is connected to the other end of said test target chain and to the other end of any one of said plurality of second chains,
    measuring a current flowing through said target selection chain to obtain a resistance value of said test target chain.

8. The method for testing a semiconductor integrated circuit according to claim 7, wherein said plurality of first chains are stacked on a first region, and said plurality of second chains are stacked on a second region.

9. The method for testing a semiconductor integrated circuit according to claim 7, wherein said plurality of first chains and said plurality of second chains are alternately stacked in a stacking direction.

10. The method for testing a semiconductor integrated circuit according to claim 7, wherein each of said first chains comprises:
- a $(2n-1)^{th}$ wiring pattern part provided in $(2n-1)^{th}$ wiring layer;
- a $(2n)^{th}$ wiring pattern part provided in $(2n)^{th}$ wiring layer; and
- a $(2n-1)^{th}$ contact for connecting said $(2n-1)^{th}$ wiring pattern part and said $(2n)^{th}$ wiring pattern part, wherein said n is a positive integer number and
wherein each of said second chains comprises:
- a $(2n)^{th}$ wiring pattern part provided in said $(2n)^{th}$ wiring layer;
- a $(2n+1)^{th}$ wiring pattern part provided in $(2n+1)^{th}$ wiring layer; and
- a $(2n)^{th}$ contact for connecting said $(2n)^{th}$ wiring pattern part and said $(2n+1)^{th}$ wiring pattern part.

11. A method for testing a semiconductor integrated circuit, comprising:
- applying a first reference voltage to one end of each of a plurality of first chain groups, each comprising a plurality of first chains;
- applying a second reference voltage to one end of each of a plurality of second chain groups, each comprising a plurality of second chains;
- selecting a test target chain group from said plurality of first chain groups,
- applying said second reference voltage to a target selection electrode, wherein said target selection electrode is connected to the other end of said test target chain groups and to the other end of any one of said plurality of second chain groups; and
- measuring a current flowing through said target selection electrode to obtain a resistance value of said test target chain group.

* * * * *